(12) United States Patent
Shimizu

(10) Patent No.: US 11,984,547 B2
(45) Date of Patent: May 14, 2024

(54) WIRING BOARD, AND LIGHT EMITTING DEVICE AND DISPLAY DEVICE USING SAME

(71) Applicant: KYOCERA Corporation, Kyoto (JP)

(72) Inventor: Takashi Shimizu, Kusatsu (JP)

(73) Assignee: KYOCERA Corporation, Kyoto (JP)

( * ) Notice: Subject to any disclaimer, the term of this patent is extended or adjusted under 35 U.S.C. 154(b) by 415 days.

(21) Appl. No.: 17/312,870

(22) PCT Filed: Nov. 28, 2019

(86) PCT No.: PCT/JP2019/046599
§ 371 (c)(1),
(2) Date: Jun. 10, 2021

(87) PCT Pub. No.: WO2020/137342
PCT Pub. Date: Jul. 2, 2020

(65) Prior Publication Data
US 2022/0045250 A1 Feb. 10, 2022

(30) Foreign Application Priority Data

Dec. 26, 2018 (JP) ................................. 2018-243165

(51) Int. Cl.
*H01L 25/00* (2006.01)
*H01L 25/075* (2006.01)
*H01L 33/62* (2010.01)

(52) U.S. Cl.
CPC .......... *H01L 33/62* (2013.01); *H01L 25/0753* (2013.01)

(58) Field of Classification Search
CPC ............................ H01L 25/0753; H01L 33/62
See application file for complete search history.

(56) References Cited

U.S. PATENT DOCUMENTS

| 5,250,757 A | 10/1993 | Kawakami et al. |
| 2007/0013856 A1 | 1/2007 | Watanabe et al. |
| 2018/0190631 A1 | 7/2018 | Kim et al. |

FOREIGN PATENT DOCUMENTS

| EP | 1161124 A2 | 12/2001 |
| JP | 2003-78226 A | 3/2003 |
| JP | 2015-133394 A | 7/2015 |
| JP | 2015133394 A * | 7/2015 |

* cited by examiner

*Primary Examiner* — Reema Patel
(74) *Attorney, Agent, or Firm* — Procopio, Cory, Hargreaves & Savitch LLP

(57) ABSTRACT

A wiring board includes: a glass substrate serving as a substrate, which includes a first surface, a second surface which is opposite to the first surface, and a side surface; an input electrode serving an electrode, which is located close to a side of the first surface; an insulating layer disposed on the glass substrate; and a side wiring disposed so as to extend from the input electrode via the side surface to the second surface. An end of the insulating layer located close to the side is provided with a cutaway portion extending in an inward direction of the insulating layer, the input electrode is disposed in an entrance-side part of the cutaway portion, and the cutaway portion includes a bottom-side part constituting an inward area which is free of the input electrode.

6 Claims, 6 Drawing Sheets

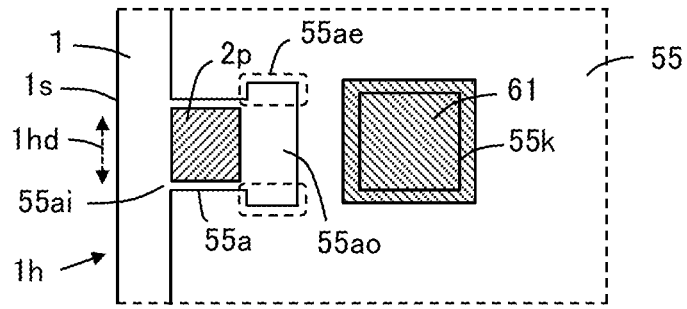
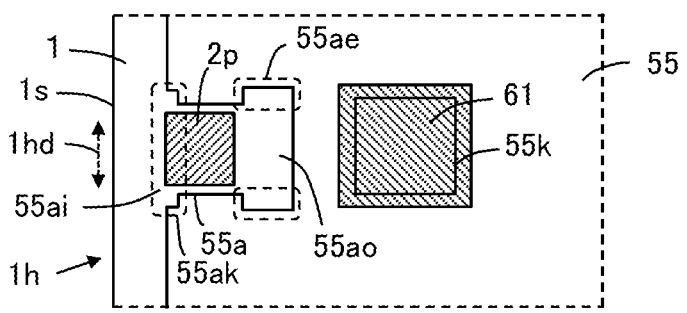
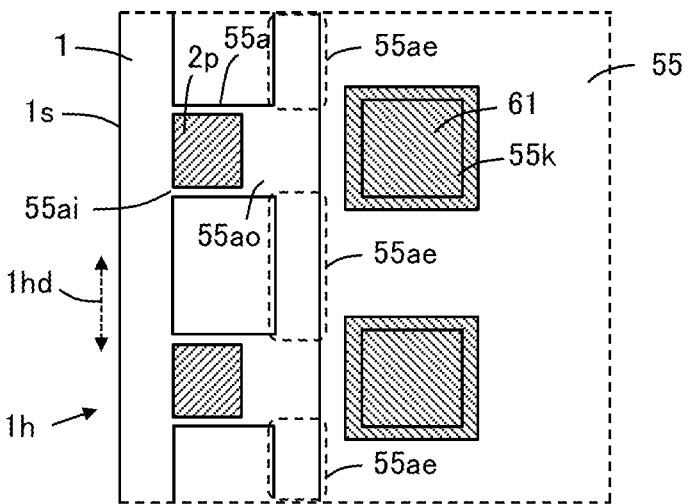

WIRING BOARD, AND LIGHT EMITTING DEVICE AND DISPLAY DEVICE USING SAME

CROSS-REFERENCE TO RELATED APPLICATION

This application is a national stage entry according to 35 U.S.C. 371 of International Application No. PCT/JP2019/046599 filed on Nov. 28, 2019, which claims priority to Japanese Patent Application No. 2018-243165 filed on Dec. 26, 2018, the contents of which are entirely incorporated herein by reference.

TECHNICAL FIELD

The present disclosure relates to a wiring board including a side wiring, and also relates to a light emitting device, as well as a display device, in which a light emitting element such as an LED (Light Emitting Diode) is placed on the wiring board.

BACKGROUND

In recent years, for example, Japanese Unexamined Patent Publication JP-A 2003-78226 (Patent Literature 1) describes a wiring board including a side wiring, and a backlight-free self-luminous display device using the wiring board including a plurality of light emitting elements such as LEDs. This display device of the related art includes: a glass substrate; scanning signal lines each arranged in a predetermined direction (row direction, for example) on the glass substrate; light emission-control signal lines which intersect the scanning signal lines and each of which is arranged in a direction perpendicular to the predetermined direction (column direction, for example); an effective region including a plurality of pixel portions (Pmn) demarcated by the scanning signal lines and the light emission-control signal lines; and a plurality of light emitting elements disposed on an insulating layer. The scanning signal lines and the light emission-control signal lines are connected to back wiring disposed on a back surface of the glass substrate via a side wiring disposed on the side surface of the glass substrate. The back wiring is connected to a drive element, such as an IC or an LSI, disposed on the back surface of the glass substrate. That is, in the display device, drive control for display is carried out by the drive element disposed on the back surface of the glass substrate. For example, the drive element is mounted on the back-surface side of the glass substrate by means of COG (Chip On Glass) or otherwise.

In each pixel portion, there is disposed a light emission-control section for control of a light emitting element located in a light emission region in respect of light-emission mode, non-light-emission mode, and light-emission intensity. The light emission-control section includes: a TFT (Thin Film Transistor) which serves as a switching element for inputting a light emission signal to the corresponding light emitting element; and a TFT which serves as a drive element for effecting current drive to the light emitting element according to a potential difference (light emission signal) between a positive voltage (anode voltage of about 3 to 5 V) and a negative voltage (cathode voltage of about −3 to 0 V) based on the level (voltage) of a light emission-control signal (a signal which is transmitted through the light emission-control signal line). On a connection line for providing connection between a gate electrode and a source electrode in the TFT, a capacitive element is disposed, and the capacitive element serves as a retention capacitance that retains the voltage of the light emission-control signal inputted to the gate electrode of the TFT over a certain period of time until initiation of succeeding reprogramming operation (one-frame period).

The light emitting element is electrically connected to the light emission-control section, a positive voltage input line, and a negative voltage input line via through conductors, such as through holes, passing through an insulating layer disposed in the effective region. That is, a positive electrode of the light emitting element is connected to the positive voltage input line via the through conductor and the light emission-control section, whereas a negative electrode of the light emitting element is connected to the negative voltage input line via the through conductor.

SUMMARY

A wiring board according to the disclosure includes: a substrate including a first surface, a second surface which is opposite to the first surface, and a side surface; an electrode located close to a side of the first surface; an insulating layer disposed on the substrate; and a side wiring disposed so as to extend from the electrode via the side surface to the second surface, wherein an end of the insulating layer located close to the side is provided with a cutaway portion extending in an inward direction of the insulating layer, the electrode is disposed in an entrance-side part of the cutaway portion, and the cutaway portion includes a bottom-side part constituting an inward area which is free of the electrode.

A light emitting device according to the disclosure includes the wiring board described above, a light emitting element which is connected to the electrode and is located on the first surface, and a drive section which is connected to the light emitting element via the side wiring and is located on the second surface.

A display device pursuant to the disclosure includes the wiring board described above, a plurality of light emitting elements each of which is connected to the electrode, the plurality of light emitting elements being arranged in a matrix on the first surface, and a drive section which is connected to the plurality of light emitting elements via the side wiring and is located on the second surface.

BRIEF DESCRIPTION OF DRAWINGS

Other and further objects, features, and advantages of the invention will be more explicit from the following detailed description taken with reference to the drawings wherein:

FIG. 2B is a plan view of still another embodiment of the wiring board according to the disclosure, illustrating the electrode and its surroundings;

FIG. 2C is a plan view of still another embodiment of the wiring board according to the disclosure, illustrating the electrode and its surroundings;

FIG. 2D is a plan view of still another embodiment of the wiring board according to the disclosure, illustrating the electrode and its surroundings;

DETAILED DESCRIPTION

Other and further objects, features, and advantages of the invention will be more explicit from the following detailed description taken with reference to the drawings.

Figure 4:
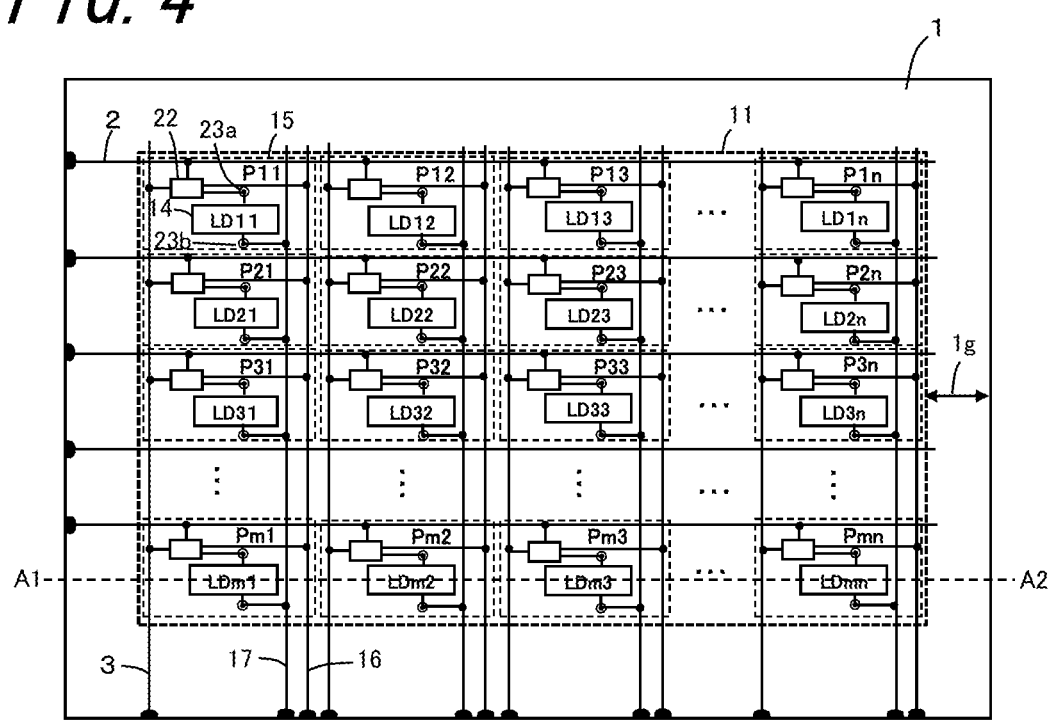
FIG. 4 is a block circuit diagram showing the basic configuration of a display device taken up as an example of a display device of the related art.
Figure 5:
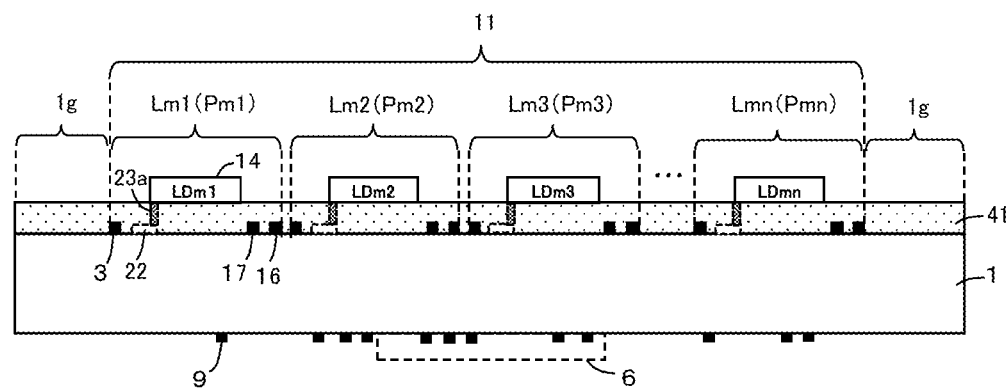
FIG. 5 is a sectional view of the display device taken along the line A1-A2 of FIG. 4.
Figure 6:
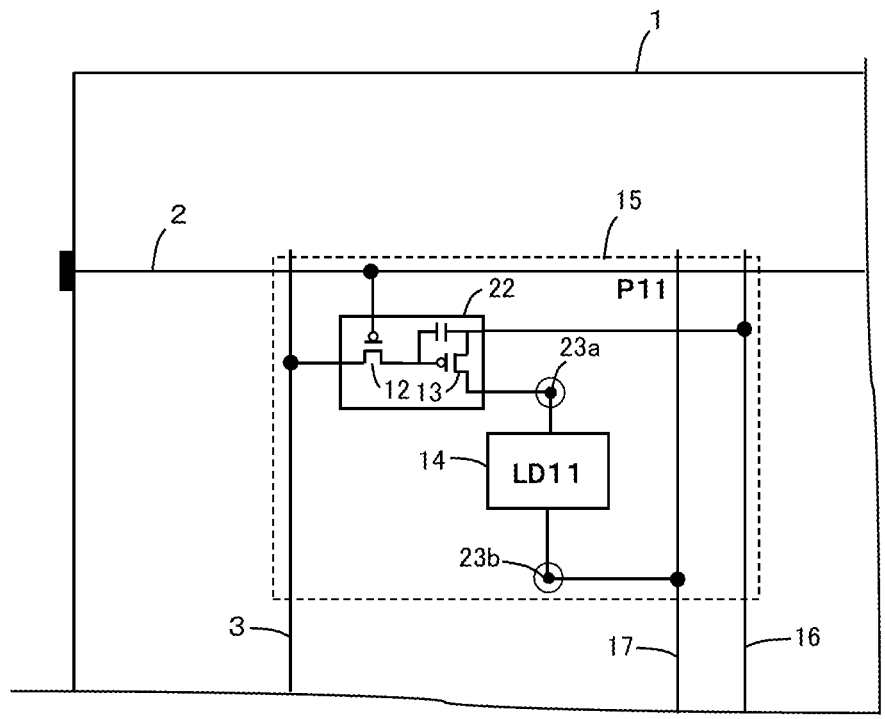
FIG. 6 is a circuit diagram of a single light emitting element and a light emission-control section connected to the light emitting element in the display device shown in FIG. 4.

Referring first to FIGS. 4 to 9, a construction underlying the display device according to the disclosure will be described. FIG. 4 shows a block circuit diagram of the basic configuration of a display device underlying the display device according to the disclosure. Moreover, FIG. 5 shows a sectional view taken along the line A1-A2 of FIG. 4. The display device includes: a glass substrate 1; scanning signal lines 2 each arranged in a predetermined direction (row direction, for example) on the glass substrate 1; light emission-control signal lines 3 which intersect the scanning signal lines 2 and each of which is arranged in a direction perpendicular to the predetermined direction (column direction, for example); an effective region 11 including a plurality of pixel portions (Pmn) demarcated by the scanning signal lines 2 and the light emission-control signal lines 3; and a plurality of light emitting elements 14 disposed on an insulating layer. The scanning signal lines 2 and the light emission-control signal lines 3 are connected to back wiring 9 disposed on a back surface of the glass substrate 1 via a side wiring disposed on the side surface of the glass substrate 1. The back wiring 9 is connected to a drive element 6, such as an IC or an LSI, disposed on the back surface of the glass substrate 1. That is, in the display device, drive control for display is carried out by the drive element 6 disposed on the back surface of the glass substrate 1. For example, the drive element 6 is mounted on the back-surface side of the glass substrate 1 by means of COG (Chip On Glass) or otherwise.

In each pixel portion 15 (Pmn), there is disposed a light emission-control section 22 for control of the light emitting element 14 (LDmn) located in a light emission region (Lmn) in respect of light-emission mode, non-light-emission mode, and light-emission intensity. The light emission-control section 22 includes a TFT (Thin Film Transistor) 12 (shown in FIG. 6) which serves as a switching element for inputting a light emission signal to the corresponding light emitting element 14, and a TFT 13 (shown in FIG. 6) which serves as a drive element for effecting current drive to the light emitting element 14 on the basis of a potential difference (light emission signal) between a positive voltage (anode voltage of about 3 to 5 V) and a negative voltage (cathode voltage of about −3 to 0 V) according to the level (voltage) of a light emission-control signal (a signal which is transmitted through the light emission-control signal line 3). On a connection line for providing connection between a gate electrode and a source electrode in the TFT 13, a capacitive element is disposed, and the capacitive element serves as a retention capacitance that retains the voltage of the light emission-control signal inputted to the gate electrode of the TFT 13 over a certain period of time until initiation of succeeding reprogramming operation (one-frame period).

The light emitting element 14 is electrically connected to the light emission-control section 22, a positive voltage input line 16, and a negative voltage input line 17 via through conductors 23a and 23b, such as through holes, passing through an insulating layer 41 (shown in FIG. 5) disposed in the effective region 11. That is, a positive electrode of the light emitting element 14 is connected to the positive voltage input line 16 via the through conductor 23a and the light emission-control section 22, whereas a negative electrode of the light emitting element 14 is connected to the negative voltage input line 17 via the through conductor 23b.

In a plan view, the display device includes a fringe part 1g, which has no involvement with display action, located between the effective region 11 and the edge of the glass substrate 1, and a light emission-control signal line drive circuit, a scanning signal line drive circuit, etc. may occasionally be placed on the fringe part 1g. It is desired that the fringe part 1g have as small a width as possible. Moreover, as a rule, a plurality of glass substrates 1 are cut from a single base substrate. In order to suppress the influence of a cut line on the light emission-control section 22, there has been proposed an arrangement as shown in the block circuit diagram of FIG. 7 in which, in the outermost pixel portion 15, the light emission-control section 22 is located more inwardly than the light emitting element 14 in the glass substrate 1, as viewed in a plan view.

Each pixel portion 15 may occasionally be formed of corresponding one of a sub-pixel portion for red light emission, a sub-pixel portion for green light emission, and a sub-pixel portion for blue light emission. The sub-pixel portion for red light emission includes a red light emitting element such as a red LED, the sub-pixel portion for green light emission includes a green light emitting element such as a green LED, and the sub-pixel portion for blue light emission includes a blue light emitting element such as a blue LED. For example, these sub-pixel portions are arranged in rows or columns.

Figure 7:
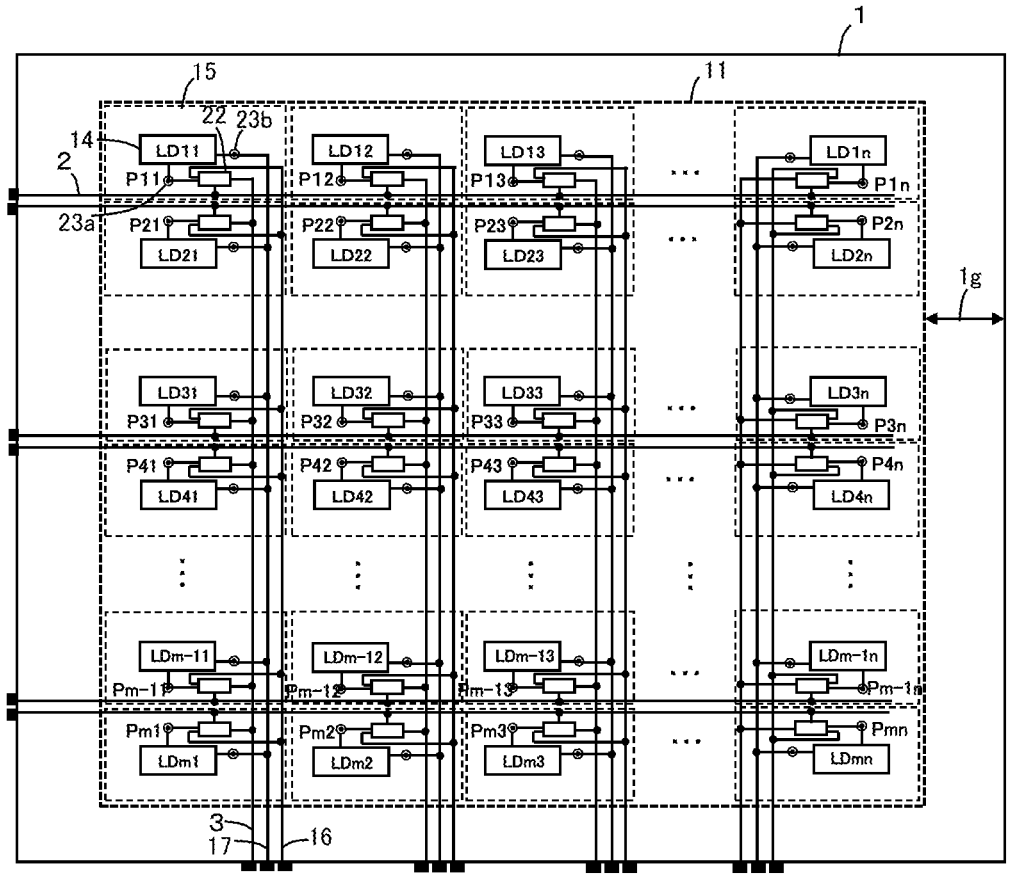
FIG. 7 is a block circuit diagram showing the basic configuration of a display device taken up as another example of the display device of the related art.
Figure 8:
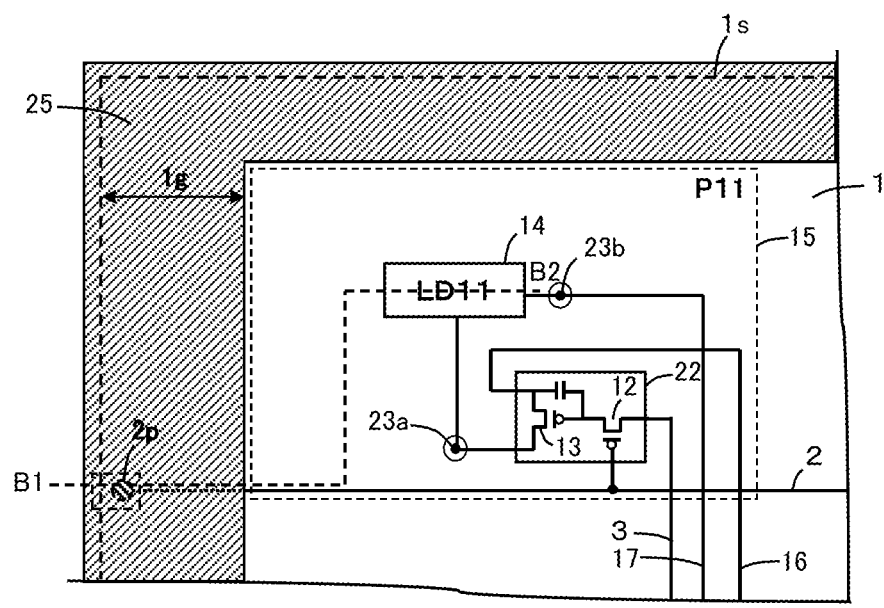
FIG. 8 is a circuit diagram of a single light emitting element and a light emission-control section connected to the light emitting element in the display device shown in FIG. 7.
Figure 9:
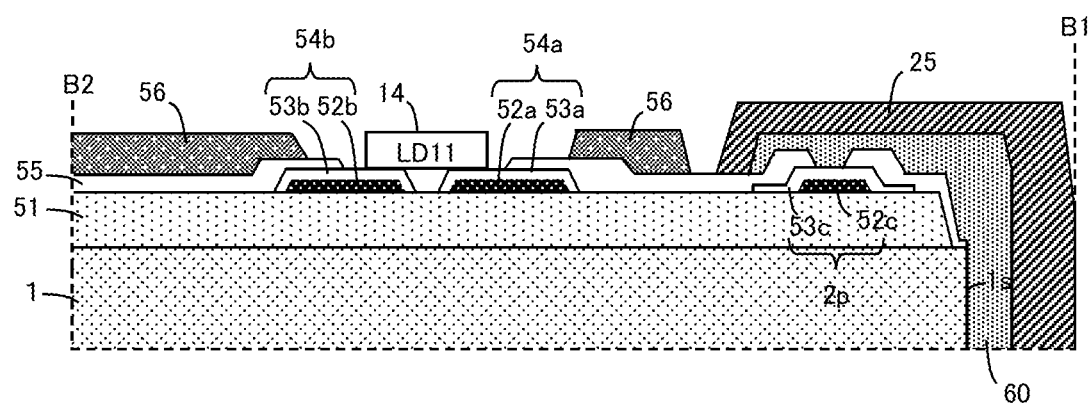
FIG. 9 is a sectional view of the display device taken along the line B1-B2 of FIG. 8.

FIG. 8 is a fragmentary plan view showing the outermost pixel portion 15 (P11) in enlarged dimension in the display device shown in FIG. 7, and FIG. 9 is a sectional view taken along the line B1-B2 of FIG. 8. As shown in these drawings, in the display device, to obscure the fringe part 1g having no involvement with display action located around the effective region 11, a light-shielding member 25 made for example of a black matrix is disposed on the fringe part 1g.

As shown in FIG. 9, a resin-made insulating layer 51, which is a layer made of resin such as acrylic resin, is disposed on the glass substrate 1, and the light emitting element 14 is mounted on the resin-made insulating layer 51. The light emitting element 14 is located at a predetermined distance from the edge of the glass substrate 1. The light emitting element 14 mounted on the resin-made insulating layer 51 is electrically connected to a positive electrode 54a and a negative electrode 54b placed on the resin-made insulating layer 51 via an electroconductive connection member such as solder. The positive electrode 54a includes: an electrode layer 52a of, for example, Mo—Al—Mo layered configuration (made by successive laminations of an Al layer and a Mo layer on a Mo layer); and a transparent electrode 53a made of, for example, ITO (Indium Tin Oxide) that covers the electrode layer 52a. Likewise, the negative electrode 54b includes: an electrode layer 52b of, for example, Mo—Al—Mo layered configuration; and a transparent electrode 53b made for example of ITO that covers the electrode layer 52b. Moreover, on a part of the resin-made insulating layer 51 located closer to a side surface 1S of the glass substrate 1 than the positive electrode 54a and the negative electrode 54b, an input electrode 2p is disposed, and the input electrode 2p includes: an electrode layer 52c; and a transparent electrode 53c made for example of ITO that covers the electrode layer 52c. The input electrode 2p is electrically connected to the positive electrode 54a, and functions as a relay electrode which is electrically connected to the back wiring 9 via a side wiring 60.

An insulating layer 55 made of, for example, silicon oxide ($SiO_2$) or silicon nitride ($SiN_x$) is placed so as to cover the resin-made insulating layer 51, part of each of the transparent electrodes 53a and 53b (a part thereof not overlapping with the light emitting element 14), and the periphery of the transparent electrode 53c. Moreover, a light-shielding layer 56 made for example of a black matrix is disposed on the insulating layer 55, except for the light emitting element 14 mounting area and the light-shielding member 25 placement area. The light-shielding layer 56 is intended to render the areas of the display device except at the light emitting element 14 dark-colored background areas, such as black background areas, as viewed in a plan view.

On the insulating layer 55, there is disposed the side wiring 60 which extends from a portion of the insulating layer 55 which covers the input electrode 2p as viewed in a plan view via the side surface of the glass substrate 1 to the back surface of the glass substrate 1 and which electrically connects the input electrode 2p and the back wiring 9. For example, the side wiring 60 is formed through the application of an electroconductive paste containing electroconductive particles such as silver particles, with the subsequent firing process. A thick-film wiring board including a thick-film communication conductor serving as such a side wiring has been proposed to date (refer to Japanese Unexamined Patent Publication JP-A 2003-78226 (Patent Literature 1), for instance).

The light-shielding member 25 is placed so as to cover the input electrode 2p and the side wiring 60. The positive electrode of the light emitting element 14 is connected to the positive electrode 54a via an electroconductive connection member such as solder, and the negative electrode of the light emitting element 14 is connected to the negative electrode 54b via an electroconductive connection member such as solder. Thus, the light emitting element 14 is mounted on the glass substrate 1.

In a related art construction such as shown in FIG. 9, a resin paste for forming the light-shielding member 25 that covers the side wiring 60 is applied so as to cover the input electrode 2p. In this case, the resin paste spreads over and beyond the input electrode 2p, and the end of the paste lies over an inward area of the glass substrate 1. Eventually, the resin paste reaches other electrode such as an electrode for inspection which is disposed near the input electrode 2p and on an inward side of the glass substrate 1, which may cause impairment of electrical connection of the other electrode.

The following describes embodiments of the wiring board, the light emitting device, and the display device according to the disclosure with reference to the drawings. Of structural components constituting the embodiments of the wiring board, the light emitting device, and the display device according to the disclosure, only the main components are shown in each drawing to be hereafter referred to for the sake of explanation of the wiring board, the light emitting device, and the display device according to the disclosure. The wiring board, the light emitting device, and the display device according to the disclosure may therefore be provided with other known constituent components, although not shown in the drawings, such as a circuit board, a wiring conductor, a control IC, LSI, etc. Moreover, in each drawing showing the wiring board, the light emitting device, and the display device according to the disclosure, the same reference symbols have been used as in FIGS. 4 to 9, in which the construction underlying the display device according to the disclosure is illustrated, for similar parts, and the detailed description of such parts will be omitted.

Figure 1A:
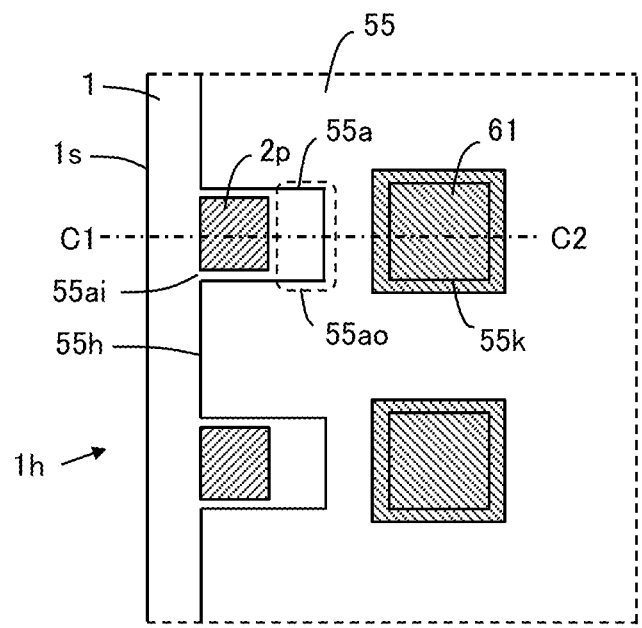
FIG. 1A is a plan view of one embodiment of a wiring board according to the disclosure, illustrating the electrode and its surroundings.
Figure 1B:
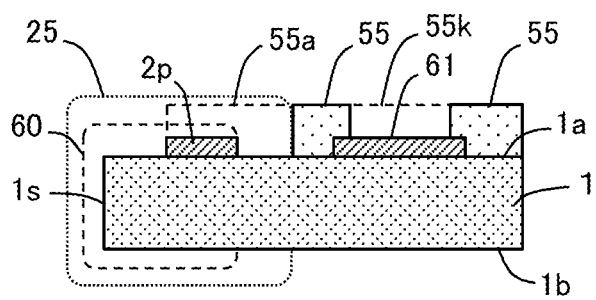
FIG. 1B is a sectional view of one embodiment of the wiring board according to the disclosure, illustrating a section taken along the line C1-C2 of FIG. 1A.

FIGS. 1A and 1B are views showing one embodiment of the wiring board. FIG. 1A is a plan view showing electrodes and their surroundings, and FIG. 1B is a sectional view taken along the line C1-C2 of FIG. 1A. The wiring board includes: a glass substrate 1, as a base plate, including a first surface 1a, a second surface 1b which is opposite to the first surface 1a, and a side surface 1s; an input electrode 2p, as an electrode, located close to a side 1h of the first surface 1a; an insulating layer 55 disposed on the glass substrate 1; and a side wiring 60 disposed so as to extend from the input electrode 2p via the side surface 1s to the second surface 1b. An end 55h of the insulating layer 55 located close to the side 1h is provided with a cutaway portion 55a extending in an inward direction of the insulating layer 55. The input electrode 2p is disposed in an entrance 55ai-side part of the cutaway portion 55a, and the cutaway portion 55a includes a bottom-side part constituting an inward area 55ao which is free of the input electrode 2p.

As shown in FIGS. 1A and 1B, an inspection electrode 61 may occasionally be disposed near the input electrode 2p and close to a center of the glass substrate 1. The insulating layer 55 covers the four sides of the quadrangular inspection electrode 61, and an opening 55k uncovers the remainder of the inspection electrode 61.

The following advantageous effects accrue from the described construction. As shown in FIG. 9 in which the construction underlying the display device according to the disclosure is illustrated, a resin paste for forming the light-shielding member 25 that covers the side wiring 60 is applied so as to cover the input electrode 2p. In this case, the resin paste spreads over and beyond the input electrode 2p, and the end of the paste lies over an inward area of the glass substrate 1. In consequence, the resin paste reaches other electrode than the input electrode such as the inspection electrode which is disposed near the input electrode 2p and on an inward side of the glass substrate 1, which may cause impairment of electrical connection of the other electrode. In the wiring board according to the disclosure, the light-shielding member 25 can be restrained from reaching other constituent member than the input electrode 2p, such as the inspection electrode 61, which should avoid contact with the light-shielding member 25. That is, since the cutaway portion 55a includes the bottom-side part constituting the inward area 55ao which is free of the input electrode 2p, the resin paste which has entered the cutaway portion 55a is stored in the inward area 55ao. As a result, it is possible to restrain the resin paste from reaching the inspection electrode 61, etc. Moreover, since the input electrode 2p is disposed in the entrance 55ai-side part of the cutaway portion 55a, due to good wettability of the input electrode 2p to an electroconductive paste for forming the side wiring 60, the electroconductive paste is drawn into the cutaway portion 55a. As a result, an advantageous effect of satisfactory connection between the input electrode 2p and the side wiring 60 is also achieved.

The glass substrate 1 provided as a base plate may be constructed of any of a plastic substrate, a ceramic substrate, and a metallic substrate, for example. The use of an insulating substrate such as a plastic substrate or a ceramic substrate is desirable from the standpoint of easiness in wiring formation. The substrate may be made in various shapes, including a quadrangular shape, a circular shape, an elliptical shape, and a trapezoidal shape.

The input electrode 2p functions as a relay electrode which is connected to the side wiring 60, and includes, for example, a metallic layer of Mo—Al—Mo layered configuration (made by successive laminations of an Al layer and a Mo layer on a Mo layer); and a transparent conductor layer made of ITO (Indium Tin Oxide), etc. that covers the metallic layer. Since the wettability of the input electrode 2p to the electroconductive paste for forming the side wiring 60 should preferably be higher than the wettability of the electroconductive paste to the glass substrate 1, the input electrode 2p may be of a Mo—Al—Mo-ITO layer form as described above, or more preferably of metallic layer form such as Al-layer form, Al—Ti layer form, Ti—Al—Ti layer form, Mo-layer form, Mo—Al—Mo layer form, Cu-layer form, Cr-layer form, Ni-layer form, or Ag-layer form.

The insulating layer 55 is formed of an inorganic insulating layer such as a silicon oxide ($SiO_2$) layer or a silicon nitride ($SiN_x$) layer, or of an organic insulating layer such as an acrylic resin layer or a polycarbonate layer. In the case where, on the glass substrate 1, the insulating layer 55 is disposed on a surface identical to a surface where the input electrode 2p is placed, or disposed on a layer identical to another insulating layer where the input electrode 2p is placed, a thickness of the insulating layer 55 is greater than a thickness of the input electrode 2p. Moreover, in the case where, on the glass substrate 1, the insulating layer 55 is disposed on a surface different from a surface where the input electrode 2p is placed, or disposed on a layer different from another insulating layer where the input electrode 2p is placed, a height of the insulating layer 55 is greater than a height of the input electrode 2p.

The side wiring 60 may be formed through the application of an electroconductive paste composed of a paste component in liquid form such as alcohol, water, or an uncured resin component blended with electroconductive particles such as silver particles, gold particles, copper particles, aluminum particles, or stainless steel particles, with the subsequent firing process. Moreover, a part of the side surface is of the glass substrate 1 which bears the side wiring 60 may be provided with a groove. In this case, the resin paste finds its way smoothly into the groove in the desired location of the side surface 1s. As above described, it is desirable to form the side wiring 60 through the application of an electroconductive paste containing electroconductive particles, with the subsequent firing process. In this case, the resulting side wiring 60 tends to include a roughened surface with asperities or irregularities derived from the electroconductive particles. The roughened surface of the side wiring 60 has the effect of restraining the resin paste from running toward the inward area 55ao of the cutaway portion 55a.

Figure 2A:
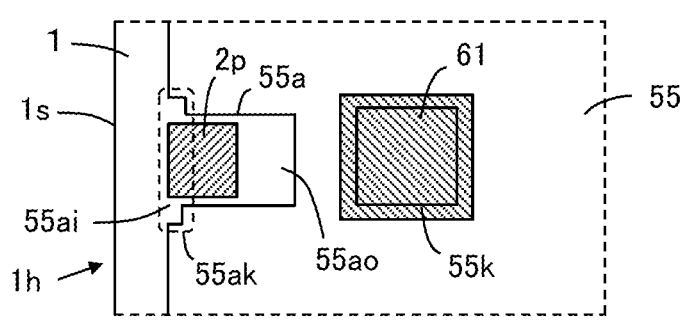
FIG. 2A is a plan view of another embodiment of the wiring board according to the disclosure, illustrating the electrode and its surroundings.

In this embodiment, preferably, as shown in FIG. 2A, the entrance 55ai-side part of the cutaway portion 55a includes a widened area 55ak. In this case, the input electrode 2p, being made of a material having good wettability to the electroconductive paste, facilitates the drawing of the electroconductive paste into the cutaway portion 55a, ensuring enhanced connection of the side wiring 60. For example, the width of the widened area 55ak is adjusted in the range of 1.1 times to twice the width of the entrance 55ai.

Moreover, preferably, the input electrode 2p is entirely received in the cutaway portion 55a. In this case, in the direction of movement of the electroconductive paste (in a direction from the entrance 55ai of the cutaway portion 55a inward), a gap is provided between the input electrode 2p and the cutaway portion 55a. In this gap, the wettability of the electroconductive paste becomes lower than the wettability of the input electrode 2p. As a result, it is possible to restrain the electroconductive paste from running rapidly from the entrance 55ai of the cutaway portion 55a toward the inward area 55ao thereof, and restrain the electroconductive paste from entering the inward area 55ao to an excessive degree.

Moreover, preferably, as shown in FIG. 1A, when the side 1h is viewed in a plan view, the end 55h of the insulating layer 55 does not reach the side surface 1s. In this case, a part of the first surface 1a located between the end 55h of the insulating layer 55 and the side surface is serves as the path of the running resin paste and also as a reservoir for the resin paste, and in addition, the end 55h of the insulating layer 55 serves as a shoulder (dam) for the resin paste. Accordingly, it is possible to restrain superfluous resin paste from reaching the inspection electrode 61.

In this embodiment, preferably, as shown in FIG. 2B, the inward area 55ao of the cutaway portion 55a includes an extended part 55ae extending in a direction 1hd parallel to the side 1h. In this case, the inward area 55ao increases in size (inner volumetric capacity) and thus grows in performance capability as the reservoir for the resin paste. In consequence, it is possible to further restrain superfluous resin paste from reaching the inspection electrode 61. Moreover, in this case, the inward area 55ao including the extended part 55ae may be at least partly curvilinear, such as circular, elliptic, or oblong, in a planar configuration. This configuration can effectively restrain superfluous resin paste from spreading out of the inward area 55ao, and thus achieves an advantageous effect that the performance of the inward area 55ao as the reservoir is further improved.

Moreover, the cutaway portion 55a may be defined by an area in which the insulating layer 55 is not formed. In this case, the cutaway portion 55a has a maximum depth, and it is possible to further restrain superfluous resin paste from reaching the inspection electrode 61. In the case where the insulating layer 55 remains at the lower part of the cutaway portion 55a, the input electrode 2p may be disposed on the remaining insulating layer 55. In this case, the lower part of the cutaway portion 55a contains a component which is the same as or analogous to that constituting the resin paste, and thus exhibits higher wettability to the resin paste. This increases the effect of drawing the resin paste into the cutaway portion 55a.

Moreover, in this embodiment, preferably, as shown in FIG. 2C, the entrance 55ai-side part of the cutaway portion 55a includes a widened area 55ak, and also the inward area 55ao of the cutaway portion 55a includes an extended part 55ae extending in a direction 1hd parallel to the side 1h. In this case, it is possible to smoothly draw the electroconductive paste into the cutaway portion 55a with the consequent attainment of enhanced connection of the side wiring 60, and it is also possible to further restrain superfluous resin paste from reaching the inspection electrode 61. In a plan view, the widened area 55ak may have a funnel-like shape defined by two straight line segments inclined relative to the side of the end of the insulating layer 5. In this case, the widened area 55ak has a taper whose width is gradually decreased from the entrance-side part toward the bottom-side part of the cutaway portion 55a, and thus has the effect of facilitating the drawing of the electroconductive paste into the cutaway portion 55a.

Moreover, in this embodiment, preferably, as shown in FIG. 2D, a plurality of cutaway portions 55a are provided, and their extended parts 55ae are connected. In this case, the resin paste running through the cutaway portion 55a collects in the extended part 55ae while being restrained against further movement, and consequently, it is possible to further restrain superfluous resin paste from reaching the inspection electrode 61. Moreover, in a plan view, the extended part 55ae may include a bulge area expanding in the inward direction and/or an opposite direction to the inward direction. This configuration provides greater facility for the resin paste to collect in the extended part 55ae. The bulge area may be curvilinear, such as partially circular, partially elliptic, or partially oblong, in a planar configuration. This configuration increases the resin-paste storage effect. Moreover, the extended part 55ae may be defined by an area in which the insulating layer 55 is formed. In this case, the extended part 55ae has a maximum depth, and it is possible to further restrain superfluous resin paste from reaching the inspection electrode 61.

The cutaway portion 55a measures about 1 μm to 100 μm in depth, about 5 μm to 500 μm in width, and about 100 μm to 1000 μm in length in the inward direction. The extended part 55ae measures about 1 μm to 100 μm in depth, and about 50 μm to 1000 μm in width.

Figure 3:
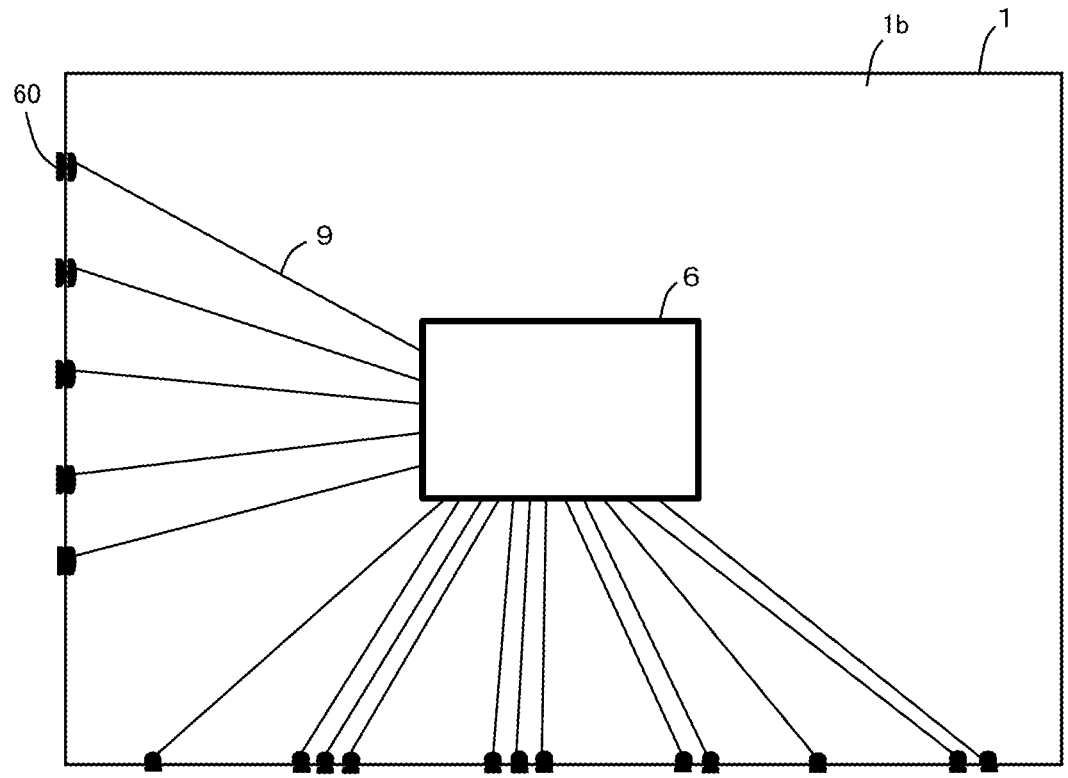
FIG. 3 is a plan view of another embodiment of the light emitting device, as well as the display device, using the wiring board according to the disclosure, illustrating the configuration of a second-surface side of the substrate.

As shown in FIG. 3, the light emitting device according to the disclosure is designed as a light emitting device including the wiring board according to the disclosure, the light emitting element 14 (as shown in FIGS. 4 to 9) which is connected to the input electrode 2p and is located on the first surface 1a, and the drive section 6 which is connected to the light emitting element via the side wiring 60 and is located on the second surface 1b. Examples of light emitting elements that may be used for the light emitting element 14 of the light emitting device include self-luminous light emitting elements such as a light emitting diode (LED) in microchip form, a monolithic light emitting diode, an organic EL, an inorganic EL, and a semiconductor laser device.

On the second surface (back surface) 1b of the glass substrate 1, the back wiring 9 connected to the side wiring 60 is disposed. The back wiring 9 is connected to the drive element 6 serving as the drive section, such as an IC or an LSI, disposed on the second surface 1b of the glass substrate 1. That is, in the light emitting device, drive control for light emission is carried out by the drive element 6 disposed on the second surface 1b of the glass substrate 1. For example, the drive element 6 is mounted on the second-surface 1b side of the glass substrate 1 by means of COG (Chip On Glass) or otherwise. The drive section is not limited to the drive element 6, but may be of, for example, a drive circuit substrate or a drive circuit constructed of a TFT includes an LTPS (Low-temperature Poly Silicon)-made semiconductor layer formed on the glass substrate 1. The light emitting device is used as an illumination device, a printer head, etc.

The display device according to the disclosure is designed as a display device including the wiring board according to the disclosure, a plurality of light emitting elements 14 each of which is connected to the input electrode 2p, the plurality of light emitting elements 14 being arranged in a matrix on the first surface 1a, and the drive section which is connected to the plurality of light emitting elements 14 via the side wiring 60 and is located on the second surface 1b. Examples of light emitting elements that may be used for the light emitting element 14 of the display device include self-luminous light emitting elements such as a light emitting diode (LED) in microchip form, a monolithic light emitting diode, an organic EL, an inorganic EL, and a semiconductor laser device, and also elements of transmitted light-control type such as a unit liquid crystal display.

On the second surface (back surface) 1b of the glass substrate 1, the back wiring 9 connected to the side wiring 60 is disposed, and the back wiring 9 is connected to the drive element 6 serving as the drive section, such as an IC or an LSI, disposed on the second surface 1b of the glass substrate 1. That is, in the display device, drive control for light emission is carried out by the drive element 6 disposed on the second surface 1b of the glass substrate 1. For example, the drive element 6 is mounted on the second-surface 1b side of the glass substrate 1 by means of COG (Chip On Glass) or otherwise. The drive section is not limited to the drive element 6, but may be of, for example, a drive circuit substrate or a drive circuit constructed of a TFT including an LTPS (Low-temperature Poly Silicon)-made semiconductor layer formed on the glass substrate 1.

A large-sized combined display equipment, or so-called multifunction display may be constructed by arranging (tiling) a plurality of glass substrates 1, each equipped with the plurality of light emitting elements 14, in a matrix on the same plane, with their side surfaces joined together by an adhesive or the like.

The wiring board, the light emitting device, and the display device according to the disclosure are not limited to the embodiments thus far described, and suitable design modifications and improvements may be made therein. For example, the glass substrate 1 may either be a transparent glass substrate or be an opaque substrate. In the case where the glass substrate 1 is made as an opaque substrate, the glass substrate 1 may be constructed of a colored glass substrate such as a black- or gray-colored substrate, or a ground glass-made glass substrate, or also a glass-ceramic composite substrate.

The disclosure may be carried into effect in the following forms.

The wiring board according to the disclosure includes: a substrate including a first surface, a second surface which is opposite to the first surface, and a side surface; an electrode located close to a side of the first surface; an insulating layer disposed on the substrate; and a side wiring disposed so as to extend from the electrode via the side surface to the second surface, wherein an end of the insulating layer located close to the side is provided with a cutaway portion extending in an inward direction of the insulating layer, the electrode is disposed in an entrance-side part of the cutaway portion, and the cutaway portion includes a bottom-side part constituting an inward area which is free of the electrode.

In the wiring board according to the disclosure, it is preferable that the entrance-side part of the cutaway portion includes a widened area.

In the wiring board according to the disclosure, it is also preferable that the electrode is entirely received in the cutaway portion.

In the wiring board according to the disclosure, it is also preferable that, when the side of the first surface is viewed in a plan view, the end of the insulating layer does not reach the side surface.

In the wiring board according to the disclosure, it is also preferable that the inward area of the cutaway portion includes an extended part extending in a direction parallel to the side of the first surface.

The light emitting device according to the disclosure is designed as a light emitting device including the wiring board described above, a light emitting element which is connected to the electrode and is located on the first surface, and a drive section which is connected to the light emitting element via the side wiring and is located on the second surface.

The display device according to the disclosure is designed as a display device including the wiring board described above, a plurality of light emitting elements each of which is connected to the electrode, the plurality of light emitting elements being arranged in a matrix on the first surface, and a drive section which is connected to the plurality of light emitting elements via the side wiring and is located on the second surface.

The wiring board according to the disclosure includes: the substrate including the first surface, the second surface which is opposite to the first surface, and the side surface; the electrode located close to the side of the first surface; the insulating layer disposed on the substrate; and the side wiring disposed so as to extend from the electrode via the side surface to the second surface, wherein the end of the insulating layer located close to the side is provided with the cutaway portion extending in an inward direction of the insulating layer, the electrode is disposed in the entrance-side part of the cutaway portion, and the cutaway portion includes the bottom-side part constituting the inward area which is free of the electrode. The following advantageous effects accrue from this construction. A resin paste, which forms a light-shielding member as an overcoat on the side wiring, can be restrained from reaching other constituent member than the input electrode, such as an inspection electrode, which should avoid contact with the paste. That is, since the cutaway portion includes the bottom-side part constituting the inward area which is free of the input electrode, the resin paste which has entered the cutaway portion is stored in the inward area. As a result, it is possible to restrain the resin paste from reaching the inspection electrode, etc. Moreover, since the electrode is disposed in the entrance-side part of the cutaway portion, due to good wettability of the electrode to an electroconductive paste for forming the side wiring, the electroconductive paste is drawn into the cutaway portion. As a result, an advantageous effect of satisfactory connection between the electrode and the side wiring is also achieved.

In the wiring board according to the disclosure, in the case where the entrance-side part of the cutaway portion includes a widened area, the electrode made of a material having good wettability to the electroconductive paste for forming the side wiring facilitates the drawing of the electroconductive paste into the cutaway portion, ensuring enhanced connection of the side wiring.

Moreover, in the wiring board according to the disclosure, where the electrode is entirely received in the cutaway portion, in the direction of movement of the electroconductive paste (in a direction from the entrance of the cutaway portion inward), a gap is provided between the electrode and the cutaway portion. In this gap, the wettability of the electroconductive paste becomes lower than the wettability of the electrode. As a result, it is possible to restrain the electroconductive paste from running rapidly from the entrance of the cutaway portion toward the inward area thereof, and restrain the electroconductive paste from entering the inward area to an excessive degree.

Moreover, in the wiring board according to the disclosure, in the case where the end of the insulating layer do not reach the side surface when the side of the first surface is viewed in the plan view, a part of the first surface located between the end of the insulating layer and the side surface serves as the path of the running resin paste and also as a reservoir for the resin paste, and in addition, the end of the insulating layer serves as a shoulder (dam) for the resin paste. In consequence, it is possible to further restrain superfluous resin paste from reaching the inspection electrode.

Moreover, in the wiring board according to the disclosure, in the case where the inward area of the cutaway portion includes an extended part extending in a direction parallel to the side of the first surface, the inward area increases in size (inner volumetric capacity) and thus grows in performance capability as the reservoir for the resin paste. In consequence, it is possible to further restrain superfluous resin paste from reaching the inspection electrode, etc.

The light emitting device according to the disclosure is designed as a light emitting device including the wiring board described above, a light emitting element which is connected to the electrode and is located on the first surface, and a drive section which is connected to the light emitting element via the side wiring and is located on the second surface. Accordingly, there is obtained the light emitting device in which connectivity of the side wiring is satisfactory and other electrode such as an inspection electrode is highly electrically reliable.

The display device according to the disclosure is designed as a display device including the wiring board described above, a plurality of light emitting elements each of which is connected to the electrode, the plurality of light emitting elements being arranged in a matrix on the first surface, and a drive section which is connected to the plurality of light emitting elements via the side wiring and is located on the second surface. Accordingly, there is obtained the display device in which connectivity of the side wiring is satisfactory and other electrode such as an inspection electrode is highly electrically reliable.

INDUSTRIAL APPLICABILITY

The display device according to the disclosure may be built as a self-luminous display device such as a LED display device or an organic EL display device, or a liquid crystal display device. Moreover, the display device according to the disclosure is applicable to various types of an electronic device. Examples of the electronic device to which the display device is applicable include a large-size combined display device (multifunction display), an automotive route guidance system (car navigation system), a route guidance system for boats and ships, a route guidance system for aircraft, a smartphone terminal, a mobile phone, a tablet terminal, a personal digital assistant (PDA), a video camera, a digital still camera, an electronic notepad, an electronic book, an electronic dictionary, a personal computer, a copier, a video-game machine terminal, a television set, a product indication tag, a price indication tag, an industrial programmable display device, a car audio device, a digital audio player, a facsimile, a printer, an automated teller machine (ATM), a vending machine, a head-mounted display (HMD), a digital wristwatch, and a smartwatch.

The disclosure may be embodied in other specific forms without departing from the spirit or essential characteristics thereof. The present embodiments are therefore to be considered in all respects as illustrative and not restrictive, the scope of the disclosure being indicated by the appended claims rather than by the foregoing description and all changes which come within the meaning and the range of equivalency of the claims are therefore intended to be embraced therein.

REFERENCE SIGNS LIST

1: Glass substrate
1*a*: First surface
1*b*: Second surface
1*h*: Side
1*s*: Side surface
2*p*: Input electrode
6: Drive element
14: Light emitting element
55: Insulating layer
55*a*: Cutaway portion
55*ae*: Extended part
55*ai*: Entrance
55*ak*: Widened area
55*ao*: Inward area
55*h*: End of insulating layer
55*k*: Opening
60: Side wiring
61: Inspection electrode

The invention claimed is:

1. A wiring board comprising:
a substrate comprising a first surface, a second surface which is opposite to the first surface, and a side surface;
an electrode located at a portion of a side of the first surface;
an insulating layer disposed on the substrate; and
a side wiring disposed so as to extend from the electrode via the side surface to the second surface,
an end of the insulating layer with a cutaway portion extending in an inward direction of the insulating layer,
the electrode being disposed in an entrance-side part of the cutaway portion, and the cutaway portion comprising a bottom-side part constituting an inward area which is free of the electrode,
the electrode being entirely received in the cutaway portion.

2. The wiring board according to claim 1, wherein the entrance-side part of the cutaway portion includes a widened area.

3. The wiring board according to claim 1, wherein the end of the insulating layer does not reach the side surface when the side of the first surface is viewed in a plan view of the wiring board.

4. The wiring board according to claim 1, wherein the inward area of the cutaway portion includes an extended part extending in a direction parallel to the side of the first surface.

5. A light emitting device, comprising:
the wiring board according to claim 1;
a light emitting element which is connected to the electrode and is located on the first surface; and
a drive section which is connected to the light emitting element via the side wiring and located on the second surface.

6. A display device, comprising:
the wiring board according to claim 1;
a plurality of light emitting elements each of which is connected to the electrode, the plurality of light emitting elements being arranged in a matrix on the first surface; and
a drive section which is connected to the plurality of light emitting elements via the side wiring and is located on the second surface.

* * * * *